(12) United States Patent
Chen et al.

(10) Patent No.: US 10,636,659 B2
(45) Date of Patent: *Apr. 28, 2020

(54) SELECTIVE DEPOSITION FOR SIMPLIFIED PROCESS FLOW OF PILLAR FORMATION

(71) Applicant: Applied Materials, Inc., Santa Clara, CA (US)

(72) Inventors: Yihong Chen, San Jose, CA (US); Ziqing Duan, San Jose, CA (US); Yong Wu, Sunnyvale, CA (US); Abhijit Basu Mallick, Palo Alto, CA (US); Srinivas Gandikota, Santa Clara, CA (US)

(73) Assignee: Applied Materials, Inc., Santa Clara, CA (US)

(*) Notice: Subject to any disclaimer, the term of this patent is extended or adjusted under 35 U.S.C. 154(b) by 0 days.

This patent is subject to a terminal disclaimer.

(21) Appl. No.: 15/951,726

(22) Filed: Apr. 12, 2018

(65) Prior Publication Data

US 2018/0308694 A1 Oct. 25, 2018

Related U.S. Application Data

(60) Provisional application No. 62/489,590, filed on Apr. 25, 2017.

(51) Int. Cl.
*H01L 21/033* (2006.01)
*H01L 21/285* (2006.01)
*H01L 21/02* (2006.01)

(52) U.S. Cl.
CPC .... *H01L 21/0338* (2013.01); *H01L 21/02244* (2013.01); *H01L 21/285* (2013.01); *H01L 21/0332* (2013.01)

(58) Field of Classification Search
None
See application file for complete search history.

(56) References Cited

U.S. PATENT DOCUMENTS

| | | |
|---|---|---|
| 4,671,970 A | 6/1987 | Keiser et al. |
| 5,824,597 A | 10/1998 | Hong |
| 6,130,151 A | 10/2000 | Lin et al. |
| 6,143,653 A | 11/2000 | Tsai et al. |
| 6,528,884 B1 | 3/2003 | Lopatin et al. |
| 6,576,113 B1 | 6/2003 | Scherer et al. |
| 6,653,200 B2 | 11/2003 | Olsen |
| 7,192,803 B1 | 3/2007 | Lin et al. |
| 7,279,119 B2 | 10/2007 | Hellring et al. |

(Continued)

FOREIGN PATENT DOCUMENTS

| | | |
|---|---|---|
| JP | 2008108757 A | 5/2008 |
| JP | 2011060803 A | 3/2011 |

(Continued)

OTHER PUBLICATIONS

PCT International Search Report and Written Opinion in PCT/US2017/059737 dated May 18, 2018, 11 pages.

(Continued)

*Primary Examiner* — Thien F Tran
(74) *Attorney, Agent, or Firm* — Servilla Whitney LLC

(57) ABSTRACT

Methods comprising depositing a film material to form an initial film in a trench in a substrate surface are described. The film is treated to expand the film to grow beyond the substrate surface.

9 Claims, 2 Drawing Sheets

(56) References Cited

U.S. PATENT DOCUMENTS

| | | |
|---|---|---|
| 7,288,463 B1 | 10/2007 | Papasouliotis |
| 7,541,297 B2 | 6/2009 | Mallick et al. |
| 7,985,977 B2 | 7/2011 | Gogoi et al. |
| 8,034,705 B2 | 10/2011 | Choi et al. |
| 8,338,225 B2 | 12/2012 | Breitwisch et al. |
| 8,575,753 B2 | 11/2013 | Choi et al. |
| 8,951,429 B1 | 2/2015 | Liu et al. |
| 9,012,322 B2 | 4/2015 | Duong et al. |
| 9,117,884 B1 | 8/2015 | Shaviv et al. |
| 9,236,292 B2 | 1/2016 | Romero et al. |
| 9,312,220 B2 | 4/2016 | Lu et al. |
| 9,324,650 B2 | 4/2016 | Edelstein et al. |
| 9,362,165 B1 | 6/2016 | Bouche et al. |
| 9,362,413 B2 | 6/2016 | Yu et al. |
| 9,368,395 B1 | 6/2016 | Wei et al. |
| 9,490,202 B2 | 11/2016 | Lin et al. |
| 9,666,451 B2 | 5/2017 | Wallace et al. |
| 9,679,781 B2 | 6/2017 | Abatchez et al. |
| 9,721,888 B2 | 8/2017 | Chang et al. |
| 9,837,314 B2 | 12/2017 | Smith et al. |
| 10,083,834 B2 | 9/2018 | Thompson et al. |
| 10,319,604 B2 | 6/2019 | Duan et al. |
| 10,319,636 B2 | 6/2019 | Basu et al. |
| 2002/0098642 A1 | 7/2002 | Harris et al. |
| 2002/0163081 A1 | 11/2002 | Aoyama |
| 2003/0143862 A1 | 7/2003 | Iyer |
| 2004/0067649 A1 | 4/2004 | Hellring et al. |
| 2004/0118805 A1 | 6/2004 | Hareland et al. |
| 2004/0192034 A1 | 9/2004 | Ohiwa et al. |
| 2005/0121768 A1 | 6/2005 | Edelstein et al. |
| 2005/0167846 A1 | 8/2005 | Aoyama |
| 2005/0266627 A1 | 12/2005 | Furukawa et al. |
| 2006/0169576 A1 | 8/2006 | Brown et al. |
| 2006/0286806 A1 | 12/2006 | Ohkuni et al. |
| 2007/0166981 A1 | 7/2007 | Furukawa et al. |
| 2007/0199922 A1 | 8/2007 | Shen et al. |
| 2008/0160783 A1 | 7/2008 | Watanabe et al. |
| 2008/0182411 A1 | 7/2008 | Elers |
| 2008/0242097 A1 | 10/2008 | Boescke et al. |
| 2009/0017631 A1 | 1/2009 | Bencher |
| 2009/0072409 A1 | 3/2009 | Nitta et al. |
| 2009/0174040 A1 | 7/2009 | Gogoi et al. |
| 2009/0269569 A1 | 10/2009 | Fucsko et al. |
| 2010/0078617 A1 | 4/2010 | Breitwisch et al. |
| 2010/0096691 A1 | 4/2010 | Shin et al. |
| 2010/0171220 A1 | 7/2010 | Cheng-Lin |
| 2010/0173494 A1 | 7/2010 | Kobrin |
| 2010/0203725 A1 | 8/2010 | Choi et al. |
| 2010/0301480 A1 | 12/2010 | Choi et al. |
| 2010/0330805 A1 | 12/2010 | Doan et al. |
| 2011/0049568 A1 | 3/2011 | Lochtefeld et al. |
| 2011/0057317 A1 | 3/2011 | Koike et al. |
| 2011/0089393 A1 | 4/2011 | Kuo-Pin et al. |
| 2011/0207318 A1 | 8/2011 | Usami |
| 2011/0281417 A1 | 11/2011 | Gordon et al. |
| 2012/0115302 A1 | 5/2012 | Breitwisch et al. |
| 2012/0156857 A1 | 6/2012 | Cohen |
| 2012/0178235 A1 | 7/2012 | Pachamuthu et al. |
| 2013/0072019 A1 | 3/2013 | Ryan |
| 2013/0109148 A1 | 5/2013 | Oh et al. |
| 2013/0241037 A1 | 9/2013 | Jeong et al. |
| 2013/0264533 A1 | 10/2013 | Cheong et al. |
| 2014/0029181 A1 | 1/2014 | Gstrein |
| 2014/0264747 A1 | 9/2014 | Barabash |
| 2014/0264896 A1 | 9/2014 | Wei et al. |
| 2014/0327140 A1 | 11/2014 | Zhang et al. |
| 2015/0111374 A1 | 4/2015 | Bao et al. |
| 2015/0132901 A1 | 5/2015 | Wang et al. |
| 2015/0137113 A1 | 5/2015 | Yu et al. |
| 2015/0170956 A1 | 6/2015 | Naik et al. |
| 2015/0279736 A1 | 10/2015 | Hotta et al. |
| 2015/0287675 A1 | 10/2015 | Shaviv |
| 2015/0325622 A1 | 11/2015 | Zhang et al. |
| 2015/0357439 A1 | 12/2015 | Liu et al. |
| 2015/0364420 A1 | 12/2015 | Mei et al. |
| 2015/0371896 A1 | 12/2015 | Chen et al. |
| 2016/0049427 A1 | 2/2016 | Zang |
| 2016/0056074 A1 | 2/2016 | Na |
| 2016/0056104 A1 | 2/2016 | Bouche et al. |
| 2016/0068710 A1 | 3/2016 | Wang et al. |
| 2016/0093635 A1 | 3/2016 | Rabkin et al. |
| 2016/0111342 A1 | 4/2016 | Huang et al. |
| 2016/0141416 A1 | 5/2016 | Mariani et al. |
| 2016/0163587 A1 | 6/2016 | Backes et al. |
| 2016/0163640 A1 | 6/2016 | Edelstein et al. |
| 2016/0190008 A1 | 6/2016 | Chandrashekar et al. |
| 2016/0190009 A1 | 6/2016 | Wallace et al. |
| 2016/0260779 A1 | 9/2016 | Kawashima et al. |
| 2017/0076945 A1 | 3/2017 | Hudson |
| 2017/0077037 A1 | 3/2017 | Kelly et al. |
| 2017/0186849 A1 | 6/2017 | Chen et al. |
| 2017/0263563 A1 | 9/2017 | Dutta et al. |
| 2017/0338149 A1 | 11/2017 | Lin |
| 2018/0096847 A1 | 4/2018 | Thompson et al. |
| 2018/0130671 A1 | 5/2018 | Duan et al. |
| 2018/0144980 A1* | 5/2018 | Basu ............... H01L 21/76879 |
| 2018/0308694 A1 | 10/2018 | Chen et al. |
| 2018/0358260 A1 | 12/2018 | Roy et al. |

FOREIGN PATENT DOCUMENTS

| | | | |
|---|---|---|---|
| JP | 2011233922 A | 11/2011 | |
| KR | 100223334 B1 | 10/1999 | |
| KR | 20000026588 A | 5/2000 | |
| KR | 20020020969 A | 3/2002 | |
| WO | 2016/106092 A1 | 6/2016 | |
| WO | 2017136577 A1 | 8/2017 | |

OTHER PUBLICATIONS

PCT International Search Report and Written Opinion in PCT/US2018/027284 dated Aug. 2, 2018, 10 pages.

Non-Final Office Action in U.S. Appl. No. 16/394,731, dated Aug. 13, 2019, 11 pages.

PCT International Search Report and Written Opinion in PCT/US2017/037141 dated Aug. 31, 2017, 11 pages.

PCT International Search Report and Written Opinion in PCT/US2017/053936 dated Jan. 12, 2018, 10 pages.

PCT International Search Report and Written Opinion in PCT/US2017/060367 dated Feb. 22, 2018, 9 pages.

PCT International Search Report and Written Opinion in PCT/US2017/060368 dated Jan. 31, 2018, 11 pages.

PCT International Search Report and Written Opinion in PCT/US2018/019146 dated May 23, 2018, 12 pages.

PCT international Search Report and Written Opinion in PCT/US2018/036690 dated Sep. 18, 2018, 9 pages.

PCT International Search Report and Written Opinion in PCT/US2018/048503 dated Dec. 14, 2018, 10 pages.

PCT International Search Report and Written Opinion in PCT/US2018/048504 dated Dec. 13, 2018, 10 pages.

PCT International Search Report and Written Opinion in PCT/US2018/048509 dated Dec. 13, 2018, 10 pages.

PCT ISR & Written Opinion for PCT/US2018/026026, dated Jul. 26, 2018, 11 pages.

* cited by examiner

US 10,636,659 B2

SELECTIVE DEPOSITION FOR SIMPLIFIED PROCESS FLOW OF PILLAR FORMATION

CROSS-REFERENCE TO RELATED APPLICATIONS

This application claims priority to U.S. Provisional Application No. 62/489,590, filed Apr. 25, 2017, the entire disclosure of which is hereby incorporated by reference herein.

TECHNICAL FIELD

The present disclosure relates generally to methods of depositing and processing thin films. In particular, the disclosure relates to processes for filling trenches in substrates.

BACKGROUND

The semiconductor industry is rapidly developing chips with smaller and smaller transistor dimensions to gain more functionality per unit area. As the dimensions of devices continue to shrink, so does the gap/space between the devices, increasing the difficulty to physically isolate the devices from one another. Filling in the high aspect ratio trenches/spaces/gaps between devices which are often irregularly shaped with high-quality dielectric materials is becoming an increasing challenge to implementation with existing methods including gapfill, hardmasks and spacer applications. Selective deposition methods typically include depositing a mask material on a substrate and patterning the mask material to form a patterned mask. Regions of the substrate may then be exposed though the patterned mask after the patterning of the mask. The patterned mask may be removed from the substrate to expose non-implanted regions of the substrate and a material may be selectively deposited on selected regions of the substrate.

There is a need in the art for new methods for chip designs with smaller critical dimensions. Additionally, there is an ongoing need for high quality metal oxide films for hardmasks and spacer applications, as well as methods for forming patterned films on substrates.

SUMMARY

One or more embodiments of the disclosure are directed to processing methods comprising providing a substrate surface having at least one trench. The at least one trench extends a depth from the substrate surface to a bottom surface and has a width defined by a first sidewall and a second sidewall. A film material is selectively deposited to form a film substantially only in the trench. The film has a film material volume and comprises a material selected from the group consisting of Co, Cr, Fe, Mn, Nb, Os, Ta, U, W and V. The film is treated to expand the film material volume to provide an expanded film which extends beyond the substrate surface.

Additional embodiments of the disclosure are directed to processing methods comprising providing a substrate surface having at least one trench. The at least one trench extends a depth from the substrate surface to a bottom surface and has a width defined by a first sidewall and a second sidewall. A film material is selectively deposited to form an initial film having a film material volume in the trench and not on the substrate surface. The film material has a Pilling-Bedworth ratio of greater than 2 and comprises a material selected from the group consisting of Co, Cr, Fe, Mn, Nb, Os, Ta, U, W and V. The initial film is treated to form a nitride of a metal selected from the group consisting of Co, Cr, Fe, Mn, Nb, Os, Ta, U, W or V to expand the film material volume to provide an expanded film which extends beyond the substrate surface.

Further embodiments of the disclosure are directed to processing methods comprising providing a substrate surface having at least one trench. The at least one trench extends a depth from the substrate surface to a bottom surface and has a width defined by a first sidewall and a second sidewall. A film material is selectively deposited to form an initial film having a film material volume in the trench and not on the substrate surface. The film material has a Pilling-Bedworth ratio of greater than 2 and comprising a material selected from the group consisting of Co, Cr, Fe, Mn, Nb, Os, Ta, U, and V. The initial film is treated to form an oxide of a metal selected from the group consisting of Co, Cr, Fe, Mn, Nb, Os, Ta, U, or V to expand the film material volume to provide an expanded film which extends beyond the substrate surface.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments.

DETAILED DESCRIPTION

Before describing several exemplary embodiments of the disclosure, it is to be understood that the disclosure is not limited to the details of construction or process steps set forth in the following description. The disclosure is capable of other embodiments and of being practiced or being carried out in various ways.

A "substrate" as used herein, refers to any substrate or material surface formed on a substrate upon which film processing is performed during a fabrication process. For example, a substrate surface on which processing can be performed include materials such as silicon, silicon oxide, strained silicon, silicon on insulator (SOI), carbon doped silicon oxides, amorphous silicon, doped silicon, germanium, gallium arsenide, glass, sapphire, and any other materials such as metals, metal nitrides, metal alloys, and other conductive materials, depending on the application. Substrates include, without limitation, semiconductor wafers. Substrates may be exposed to a pretreatment process to polish, etch, reduce, oxidize, hydroxylate, anneal, UV cure, e-beam cure and/or bake the substrate surface. In addition to film processing directly on the surface of the substrate itself, in the present disclosure, any of the film processing steps disclosed may also be performed on an underlayer formed on the substrate as disclosed in more detail below, and the term "substrate surface" is intended to include such underlayer as the context indicates. Thus for example, where a film/layer or partial film/layer has been deposited onto a substrate surface, the exposed surface of the newly deposited film/layer becomes the substrate surface.

One or more embodiments of the disclosure are directed to methods for depositing metal oxide films for any conformal, nonconformal and/or low to high aspect ratio gap/trench/void filling applications. Embodiments of the disclosure advantageously provide methods of depositing a film (e.g., a metal oxide film) in high aspect ratio (AR) structures with small dimensions. Some embodiments of the disclosure advantageously provide methods of filling gaps without formation of a seam in the gap. One or more embodiments of the disclosure advantageously provide methods of forming self-aligned vias.

Tungsten oxide pillars can be formed in features for self-aligned patterning applications. A conformal tungsten ALD film can be used to fill a trench. After filling the trench, the over-burden (i.e., tungsten deposited on top of the substrate outside of the trenches) is removed by a chemical-mechanical planarization (CMP) process to separate the tungsten lines. The resulting tungsten lines can be annealed with oxidizing atmosphere to form tungsten oxide pillars. One drawback of this method is the use of wet process CMP to remove the over-burden. This decreases the yield and makes defect control more difficult.

Figure 1:
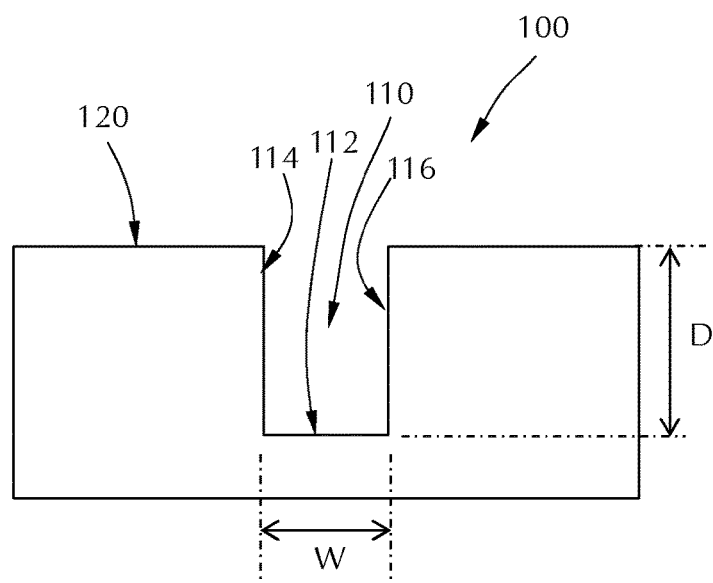
FIG. 1 shows a cross-sectional view of a substrate feature in accordance with one or more embodiments of the disclosure.

FIG. 1 shows a partial cross-sectional view of a substrate 100 with a feature 110. The Figures show substrates having a single feature for illustrative purposes; however, those skilled in the art will understand that there can be more than one feature. The shape of the feature 110 can be any suitable shape including, but not limited to, trenches and cylindrical vias. In specific embodiments, the feature 110 is a trench. As used in this regard, the term "feature" means any intentional surface irregularity. Suitable examples of features include, but are not limited to trenches which have a top, two sidewalls and a bottom, peaks which have a top and two sidewalls extending upward from a surface and vias which have sidewalls extending down from a surface with an open bottom. Features or trenches can have any suitable aspect ratio (ratio of the depth of the feature to the width of the feature). In some embodiments, the aspect ratio is greater than or equal to about 5:1, 10:1, 15:1, 20:1, 25:1, 30:1, 35:1 or 40:1.

The substrate 100 has a top surface 120. The at least one feature 110 forms an opening in the top surface 120. The feature 110 extends from the top surface 120 to a depth D to a bottom surface 112. The feature 110 has a first sidewall 114 and a second sidewall 116 that define a width W of the feature 110. The open area formed by the sidewalls and bottom are also referred to as a gap.

Figures 2A, 2B:
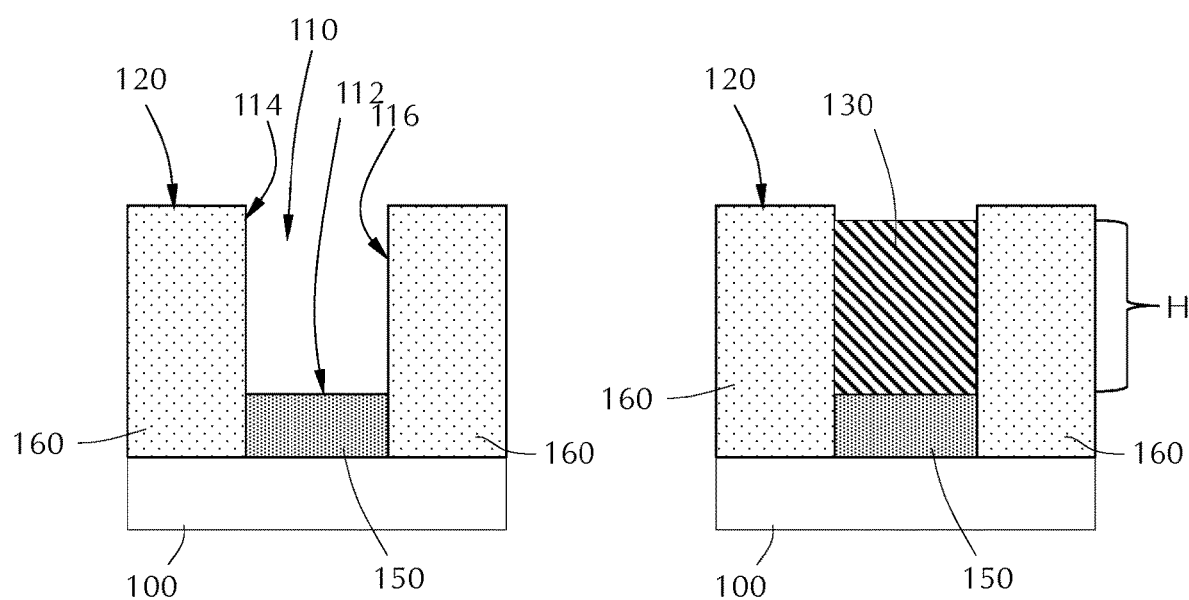
FIGS. 2A through 2C show a cross-sectional schematic of a gapfill process in accordance with one or more embodiments of the disclosure.
Figure 2C:
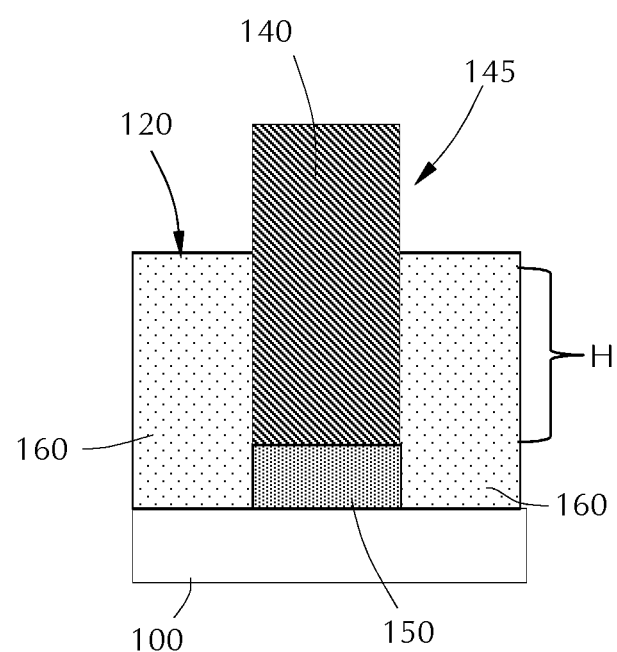

With reference to FIGS. 2A through 2C, the substrate 100 is provided for processing. As used in this regard, the term "provided" means that the substrate is placed into a position or environment for further processing. The substrate 100 illustrated in FIG. 2A has a first surface 150 and a second surface 160. The first surface 150 and the second surface 160 are different surface materials on the substrate 100. The feature 110 is formed with the bottom 112 being the first surface 150 and the sidewalls 114, 116 and the top surface 120 being the second surface.

In FIG. 2B, a film 130 is formed selectively on the first surface 150 relative to the second surface 160. The film 130 can be any suitable film formed by any suitable process including, but not limited to, chemical vapor deposition, plasma-enhanced chemical vapor deposition, atomic layer deposition, plasma-enhanced atomic layer deposition and/or physical vapor deposition. In some embodiments, the film 130 is formed by atomic layer deposition or plasma-enhanced atomic layer deposition.

The materials of the first surface 150 and the second surface 160 can be chosen to allow selective deposition of the film 130 on one surface relative to the other. In the example shown, the film 130 is formed on the first surface 150 and not the second surface 160. However, those skilled in the art will understand that the film could be formed selectively on the second surface and not the first surface.

According to the embodiment shown, the processing method includes selectively depositing a film 130 within the trench to a height H less than or equal to the depth D of the feature 110. The film can be any suitable material including, but not limited to, Co, Cr, Fe, Mn, Nb, Os, Ta, U, W and V.

The processing method further comprises treating the film 130 to expand the film material volume to provide an expanded film 140, as shown in FIG. 2C. The expanded film 140 extends beyond the substrate surface 120.

In one embodiment, the film 130, fills at least 10% of the volume of the trench. In other embodiments, the film 130 fills at least 15%, 20%, 25%, 30%, 35%, 40%, 45%, 50%, 55%, 60%, 65%, 70%, 75%, 80%, 85%, 90%, 95% or 100% of the volume of the trench. In some embodiments, the film 130 deposited in the feature 110 has a height H that is less than or equal to about 98%, 95%, 90%, 80%, 70%, 60% or 50% of the depth D of the feature 110.

In the embodiment shown, the film extends from the first sidewall 114 to the second sidewall. In one or more embodiments, treating the film results in the film volume increasing by at least 10%, 20%, 30%, 40%, 50%, 60%, 70%, 80%, 90%, 100%, 150%, 200%, 250%, 300%, 350% or 400%. When a plurality of features 110 (not shown) are filled with the film 130, a plurality of pillars 145 can be formed to provide a pattern without using a mask.

In one embodiment, treating the film 130 comprises exposing the film to an oxidizing environment. In embodiments in which treating the initial film comprises exposing the initial film to an oxidizing environment the expanded film 140 comprises a material selected from the group consisting of CoO, $Fe_2O_3$, $Fe_3O_4$, $MnO_2$, $Mn_2O_3$, $Mn_3O_4$, $MoO_3$, $Nb_2O_5$, $Ta_2O_5$, $OsO_2$, $UO_2$, and $V_2O_5$.

In some embodiments, treating the film 130 comprises exposing the initial film to a nitridating environment. In embodiments in which the initial film is exposed to a nitridating environment, the film material is selected from the group consisting of Cr, Mo and Os. In such embodiments, the expanded film comprises a material selected from the group consisting of $CrN_2$, $MoN_2$ and $OsN_2$.

In some embodiments, treating the film 130 comprises exposing the initial film to an oxidizing agent comprising one or more of $O_2$, $O_3$, $N_2O$, $H_2O$, $H_2O_2$, CO, $CO_2$, $NH_3$, $N_2/Ar$, $N_2/He$ or $N_2/Ar/He$ and/or a nitridation agent comprising one or more of ammonia, hydrazine, $NO_2$ or nitrogen plasma.

In some embodiments, treating the initial film occurs at a temperature less than or equal to about 450° C., or 400° C., or 350° C., or 300° C., or 250° C. or 200° C. In some embodiments, the film 130 is a tungsten film that is formed at a temperature in the range of about 150° C. to about 200° C.

In some embodiments, the film 130 is a metal film or a metal-containing film. Suitable metal films include, but are not limited to metals having a Pilling-Bedworth ratio greater than 2, greater than 2.25, or greater than 2.5. Pilling-Bedworth ratio refers to a ratio of a volume of the elementary cell of a metal oxide or metal nitride to the volume of the elementary cell of the corresponding metal from which the oxide or nitride is formed. The Pilling-Bedworth ratio is defined as the $V_{oxide}/V_{metal}$ or $V_{nitride}/V_{metal}$, where V is volume. For determining the Pilling-Bedworth ratio of a metal oxide, $V_{oxide}$ equals the molecular mass of the of the metal oxide multiplied by the density of the metal, and $V_{metal}$ equals the number of atoms of metal per one molecule of the oxide multiplied by the atomic mass of the metal multiplied by the density of the oxide. For determining the Pilling-Bedworth ratio of a metal nitride, $V_{nitride}$ equals the molecular mass of the of the metal nitride multiplied by the density of the metal, and $V_{metal}$ equals the number of atoms of metal per one molecule of the nitride multiplied by the atomic mass of the metal multiplied by the density of the nitride. Examples of such films include one or more of Co, Mo, W, Ta, Ti, Ru, Rh, Cu, Fe, Mn, V, Nb, Hf, Zr, Y, Al, Sn, Cr, Os, U and/or La. In some embodiments, the metal is selected from the group consisting of Co, Fe, Mn, Nb, Os, Ta, U, and V. In some embodiments, the metal has a Pilling-Bedworth ratio of greater than 2.5 and is selected from the group consisting of Mo, Os, and V. In some specific embodiments, the metal film comprises tungsten. In some specific embodiments, the metal film excludes tungsten. Suitable metal containing films include derivatives of a metal film. Suitable derivatives of the metal film include, but are not limited to, nitride, boride, carbide, oxynitride, oxyboride, oxycarbide, carbonitride, borocarbide, boronitride, borocarbonitride, borooxycarbonitride, oxycarbonitride, borooxycarbide and borooxynitride. Those skilled in the art will understand that the metal film deposited may have a non-stoichiometric amount of atoms with the metal film. For example, a film designated as WN may have different amounts of tungsten and nitrogen. The WN film may be, for example, 90 atomic % tungsten. The use of WN to describe a tungsten nitride film means that the film comprises tungsten and nitrogen atoms and should not be taken as limiting the film to a specific composition. In some embodiments, the film consists essentially of the designated atoms. For example, a film consisting essentially of WN means that the composition of the film is greater than or equal to about 95%, 98% or 99% tungsten and nitrogen atoms. In some embodiments, the film 130 comprises tungsten. In some embodiments, the film 130 consists essentially of tungsten. In one or more embodiments, the film comprises titanium. In some embodiments, the film consists essentially of titanium or titanium nitride.

In some embodiments, the film 130 is formed substantially seamlessly within the feature 110. In some embodiments, a seam may be formed within the width W of the feature 110. The seam can be any gap, space or void that forms between the walls 114, 116 of the feature 110.

In some embodiments, substantially all of the film 130 is formed within the feature 110. As used in this regard, the term "substantially all" means that greater than or equal to about 95%, 98% or 99% of the film is formed within the feature 110 on a weight basis. If the film 130 is formed on the top surface 120, the film 130 can be removed from the top surface 120 by any suitable etch process.

The film 130 can then be expanded to cause volumetric expansion to fill the feature and allow the film 130 to extend from the feature. As shown in FIG. 2C, expanding the film causes a volumetric expansion of the original film 130 to fill the feature. The expansion of the film 130 can be in the range of about 10% to about 1000%, or in the range of about 50% to about 800%, or in the range of about 100% to about 700%. In some embodiments, the film 130 expands by an amount greater than or equal to about 150%, 200%, 250%, 300% or 350%. In some embodiments, the film 130 expands an amount in the range of about 300% to about 400%.

In some embodiments, the film 130 is expanded by exposure to a siliciding agent or siliciding conditions to convert the metal or metal containing film to a metal silicide film. The siliciding agent can be any suitable siliciding agent including, but not limited to, silane, disilane, trisilane, tetrasilane, pentasilane, hexasilane, trimethyl silane, compounds with trimethylsilyl substituents and combinations thereof. In some embodiments, the siliciding conditions comprise a thermal siliciding, plasma enhanced siliciding, remote plasma siliciding, microwave and radio-frequency (e.g., ICP, CCP).

In some embodiments, the film 130 is expanded by exposure to a germanium agent or germaniciding conditions to convert the metal or metal containing film to a metal germanicide film. The germaniciding agent can be any suitable germaniciding agent including, but not limited to, germane, digermane, trigermane, tetragermane, pentagermane, hexagermane, trimethyl germanium, compounds with trimethylgermanyl substituents and combinations thereof. In some embodiments, the germaniciding conditions comprise a thermal germaniciding, plasma enhanced germaniciding, remote plasma germaniciding, microwave and radio-frequency (e.g., ICP, CCP).

As shown in FIG. 2C, during expansion, the fidelity of the feature shape is maintained on the top of the feature so that the film 130 grows straight up from the feature 110. As used in this regard, "straight up" means that the sides of the expanded film 140 are substantially coplanar with the sidewall 114, 116 of the feature 110. A surface is coplanar with the sidewall 114 where the angle formed at the junction of the sidewall 114 and the surface is ±10°.

In some embodiments, the film 130 is doped with a dopant prior to expansion. The dopant can be incorporated into the film 130 at the same time as the formation of the film 130 or in a separate process sequentially with the film deposition. For example, depositing the film 130 may occur followed by doping the film 130 with the dopant in a separate process in either the same process chamber or a different process chamber. In some embodiments, the deposition of the film 130 occurs with the doping in a single process. For example, the film precursor and dopant can be co-flowed into the processing chamber to form the film 130.

Some embodiments include an optional treatment process. The treatment process treats the film 130 to improve some parameter of the film. In some embodiments, the treatment process comprises annealing the film. In some embodiments, treatment can be performed by in-situ anneal in the same process chamber used for deposition and/or reduction. Suitable annealing processes include, but are not limited to, rapid thermal processing (RTP) or rapid thermal anneal (RTA), spike anneal, or UV cure, or e-beam cure and/or laser anneal. The anneal temperature can be in the range of about 500° C. to 900° C. The composition of the environment during anneal may include one or more of $H_2$, Ar, He, $N_2$, $NH_3$, $SiH_4$, etc. The pressure during anneal can be in the range of about 100 mTorr to about 1 atm.

According to one or more embodiments, the substrate is subjected to processing prior to and/or after forming the layer. This processing can be performed in the same chamber or in one or more separate processing chambers. In some embodiments, the substrate is moved from the first chamber to a separate, second chamber for further processing. The substrate can be moved directly from the first chamber to the separate processing chamber, or it can be moved from the first chamber to one or more transfer chambers, and then moved to the separate processing chamber. Accordingly, the processing apparatus may comprise multiple chambers in communication with a transfer station. An apparatus of this sort may be referred to as a "cluster tool" or "clustered system," and the like.

Generally, a cluster tool is a modular system comprising multiple chambers which perform various functions including substrate center-finding and orientation, degassing, annealing, deposition and/or etching. According to one or more embodiments, a cluster tool includes at least a first chamber and a central transfer chamber. The central transfer chamber may house a robot that can shuttle substrates between and among processing chambers and load lock chambers. The transfer chamber is typically maintained at a vacuum condition and provides an intermediate stage for shuttling substrates from one chamber to another and/or to a load lock chamber positioned at a front end of the cluster tool. Two well-known cluster tools which may be adapted for the present invention are the Centura® and the Endura®, both available from Applied Materials, Inc., of Santa Clara, Calif. However, the exact arrangement and combination of chambers may be altered for purposes of performing specific steps of a process as described herein. Other processing chambers which may be used include, but are not limited to, cyclical layer deposition (CLD), atomic layer deposition (ALD), chemical vapor deposition (CVD), physical vapor deposition (PVD), etch, pre-clean, chemical clean, thermal treatment such as RTP, plasma nitridation, degas, orientation, hydroxylation and other substrate processes. By carrying out processes in a chamber on a cluster tool, surface contamination of the substrate with atmospheric impurities can be avoided without oxidation prior to depositing a subsequent film.

According to one or more embodiments, the substrate is continuously under vacuum or "load lock" conditions, and is not exposed to ambient air when being moved from one chamber to the next. The transfer chambers are thus under vacuum and are "pumped down" under vacuum pressure. Inert gases may be present in the processing chambers or the transfer chambers. In some embodiments, an inert gas is used as a purge gas to remove some or all of the reactants. According to one or more embodiments, a purge gas is injected at the exit of the deposition chamber to prevent reactants from moving from the deposition chamber to the transfer chamber and/or additional processing chamber. Thus, the flow of inert gas forms a curtain at the exit of the chamber.

The substrate can be processed in single substrate deposition chambers, where a single substrate is loaded, processed and unloaded before another substrate is processed. The substrate can also be processed in a continuous manner, similar to a conveyer system, in which multiple substrate are individually loaded into a first part of the chamber, move through the chamber and are unloaded from a second part of the chamber. The shape of the chamber and associated conveyer system can form a straight path or curved path. Additionally, the processing chamber may be a carousel in which multiple substrates are moved about a central axis and are exposed to deposition, etch, annealing, cleaning, etc. processes throughout the carousel path.

During processing, the substrate can be heated or cooled. Such heating or cooling can be accomplished by any suitable means including, but not limited to, changing the temperature of the substrate support and flowing heated or cooled gases to the substrate surface. In some embodiments, the substrate support includes a heater/cooler which can be controlled to change the substrate temperature conductively.

In one or more embodiments, the gases (either reactive gases or inert gases) being employed are heated or cooled to locally change the substrate temperature. In some embodiments, a heater/cooler is positioned within the chamber adjacent the substrate surface to convectively change the substrate temperature.

The substrate can also be stationary or rotated during processing. A rotating substrate can be rotated continuously or in discrete steps. For example, a substrate may be rotated throughout the entire process, or the substrate can be rotated by a small amount between exposures to different reactive or purge gases. Rotating the substrate during processing (either continuously or in steps) may help produce a more uniform deposition or etch by minimizing the effect of, for example, local variability in gas flow geometries.

Reference throughout this specification to "one embodiment," "certain embodiments," "one or more embodiments" or "an embodiment" means that a particular feature, structure, material, or characteristic described in connection with the embodiment is included in at least one embodiment of the disclosure. Thus, the appearances of the phrases such as "in one or more embodiments," "in certain embodiments," "in one embodiment" or "in an embodiment" in various places throughout this specification are not necessarily referring to the same embodiment of the disclosure. Furthermore, the particular features, structures, materials, or characteristics may be combined in any suitable manner in one or more embodiments.

Although the disclosure herein has been described with reference to particular embodiments, it is to be understood that these embodiments are merely illustrative of the principles and applications of the present disclosure. It will be apparent to those skilled in the art that various modifications and variations can be made to the method and apparatus of the present disclosure without departing from the spirit and scope of the disclosure. Thus, it is intended that the present disclosure include modifications and variations that are within the scope of the appended claims and their equivalents.

What is claimed is:

1. A processing method comprising:
   providing a substrate surface having at least one trench, the at least one trench extending a depth from the substrate surface to a bottom surface, the at least one trench having a width defined by a first sidewall and a second sidewall;
   selectively depositing a film material to form a film substantially only in the trench, the film having a film material volume and comprising a material selected from the group consisting of Cr, Mo, and Os, wherein the film has a height that is less than or equal to about 98% of the depth of the trench; and
   treating the film to expand the film material volume to provide an expanded film which extends beyond the substrate surface, wherein the film material volume increases by at least 100%.

2. The method of claim 1, wherein treating the film comprises exposing the film to a nitridating environment.

3. The method of claim 1, wherein the expanded film comprises a material selected from the group consisting of $CrN_2$, $MoN_2$ and $OsN_2$.

4. The method of claim 1, wherein treating the film comprises exposing the film to an oxidizing agent comprising one or more of $O_2$, $O_3$, $N_2O$, $H_2O$, $H_2O_2$, $CO$, $CO_2$, $NH_3$, $N_2/Ar$, $N_2/He$ or $N_2/Ar/He$ and/or a nitridation agent comprising one or more of ammonia, hydrazine, $NO_2$ or nitrogen plasma.

5. The method of claim 1, wherein treating the film occurs at a temperature less than or equal to about 400° C.

6. The method of claim 5, wherein treating the film occurs at a temperature less than or equal to about 350° C.

7. The method of claim 6, wherein treating the film occurs at a temperature less than or equal to about 300° C.

8. A processing method comprising:
providing a substrate surface having at least one trench, the at least one trench extending a depth from the substrate surface to a bottom surface, the at least one trench having a width defined by a first sidewall and a second sidewall;
selectively depositing a film material to form an initial film having a film material volume in the trench and not on the substrate surface, the film material having a Pilling-Bedworth ratio of greater than 2 and comprising a material selected from the group consisting of Cr, Mo, and Os, wherein the film has a height that is less than or equal to about 98% of the depth of the trench; and
treating the initial film to form a nitride of a metal selected from the group consisting of Cr, Mo, and Os to expand the film material volume to provide an expanded film which extends beyond the substrate surface, wherein the film material volume increases by at least 100%.

9. The method of claim 8, wherein the expanded film comprises a material selected from the group consisting of $CrN_2$, $MoN_2$ and $OsN_2$.

* * * * *